United States Patent [19]
Koide et al.

[11] Patent Number: 5,993,679
[45] Date of Patent: Nov. 30, 1999

[54] METHOD OF CLEANING METALLIC FILMS BUILT UP WITHIN THIN FILM DEPOSITION APPARATUS

[75] Inventors: Tomoaki Koide, Fuchu; Akiko Kobayashi, Sakurashin-machi; Ko Sang Tae, Hachiouzi; Atsushi Sekiguchi, Hino; Osamu Okada, Yokohama, all of Japan

[73] Assignee: Anelva Corporation, Fuchu, Japan

[21] Appl. No.: 09/072,559

[22] Filed: May 5, 1998

Related U.S. Application Data

[60] Provisional application No. 60/073,552, Feb. 3, 1998.

[30] Foreign Application Priority Data

Nov. 6, 1997 [JP] Japan ................................ 9-320429

[51] Int. Cl.$^6$ ...................................................... C23F 1/02
[52] U.S. Cl. ................................................ 216/74; 216/2
[58] Field of Search ............................ 148/223; 118/715, 118/683; 216/2, 74

[56] References Cited

U.S. PATENT DOCUMENTS

| | | | |
|---|---|---|---|
| 5,009,725 | 4/1991 | Ellison et al. | 148/23 |
| 5,062,902 | 11/1991 | Ellison et al. | 148/23 |
| 5,094,701 | 3/1992 | Norman et al. | 148/23 |
| 5,174,825 | 12/1992 | White, Jr. et al. | 118/715 |
| 5,221,366 | 6/1993 | Roberts et al. | 148/22 |
| 5,453,494 | 9/1995 | Kirlin et al. | 534/15 |

OTHER PUBLICATIONS

M.A. George et al., "Reaction of 1,1,1,5,5,5–Hexafluoro–2, 4–pentanedione (H $^+$hfac) with CuO, Cu$_2$O and Cu Films", *J. Electrochem. Soc.*, vol. 142, No. 3, Mar. 1985.

Mark J. Hampden–Smith et al., "Copper Etching: New Chemical Approaches", MRS Bulletin/Jun. 1993.

A. Jain et al., A New Route to Thermal Dry–Etching of Copper using Hydrogen Peroxide (H$_2$O$_2$) and Hexafluoro-acetylacetone (HFACH), SPIE, vol. 2335, pp. 52–57 (1995).

Y. Tsuchiya et al., "Ultra–Low Resistance Direct Contact Cu Via Technology Using In–Situ Chemical Vapor Cleaning", 1997 Symposium On VLSI Technology, Digest of Technical Papers, Jun. 10–12, 1997.

"Removal of contamination in connection pores: A solution for multi–layer CU Wiring", *Nikkan Kogyo Shinbun*, NEC, Jul. 10, 1997.

Y. Tsuchiya et al., "An application of Hhfac Cleaning process to low resistant via process", Extended Abstracts (The 57$^{th}$ Autumn Meeting, 1996); The Japan Society of Applied Physics, No. 2 (Sep. 7–10, 1996).

Richard Steger, et al., "Chemical Vapor Etching of Copper Using Oxygen and 1,1,1,5,5,5–Hexafluoro–2,4–pentanedione", Thin Solids Films, vol. 342, pp. 221–229, (1999).

*Primary Examiner*—Bruce Breneman
*Assistant Examiner*—Alva C Powell
*Attorney, Agent, or Firm*—Burns, Doane, Swecker & Mathis, LLP

[57] ABSTRACT

A method of cleaning metallic films built up within a thin film deposition apparatus is disclosed. The method includes an oxidation step to oxidize the metallic film and produce a film of the oxide thereof, a complexing step to complex the oxide film and produce a complex thereof, and a sublimation step to sublimate the complex. The conditions of these cleaning steps are set so that the oxidation step is the rate-determining step.

8 Claims, 6 Drawing Sheets

METHOD OF CLEANING METALLIC FILMS BUILT UP WITHIN THIN FILM DEPOSITION APPARATUS

CROSS-REFERENCE TO RELATED APPLICATIONS

This non-provisional application claims the benefit of prior filed, provisional Application No. 60/073,552, filed on Feb. 3, 1998; the content of which is hereby incorporated by reference. This application also claims the benefit of priority under 35 U.S.C. § 119 to Japanese Patent Application No. 9-320429, filed in Japan on Nov. 6, 1997; the content of which is also hereby incorporated by reference.

BACKGROUND OF THE INVENTION

1. Field of the Invention

The present invention relates to a method of cleaning metallic films built up within thin film deposition apparatus, and in particular, it relates to a cleaning method for neatly removing substances such as metallic copper that have built up within thin film deposition apparatus during deposition.

2. Description of the Related Art

Chemical gas phase etching is a hitherto known cleaning method for the removal of metallic copper, for example. From a microscopic viewpoint, the process of chemical gas phase etching can be divided into 3 steps: a step for the production of an oxide film by oxidizing the metallic copper (metallic copper oxidation step), a step to produce a copper complex by complexing the copper oxide (copper oxide complexing step), and a step to sublimate the copper complex (copper complex sublimation step). In a cleaning method comprising these steps, a sequence of chemical reactions is performed in turn by the metallic copper oxidation step, copper oxide complexing step and copper complex sublimation step, whereby the metallic copper is removed by chemical gas phase etching.

Prior references to chemical gas phase etching can be found in the following: Examined Japanese Patent Publication (JP-B) No. H7-93289 (reference 1); A. Jain, T. T. Kodas and M. J. Hampden-Smith, SPIE2335, p. 52 (1994) (reference 2); M. A. George, D. W. Hess, S. E. Beck, J. C. Ivankovits, D. A. Bohling and A. P. Lane, *J. Electrochem. Soc.*, Vol. 142, p. 961 (1995) (reference 3); and M. J. Hampden-Smith and T. T. Kodas, MRS Bulletin, p. 39 (June 1993) (reference 4).

Reference 1 discloses a vapor phase etching method for a thin metallic film on a substrate used in the production of integrated circuits, wherein the metallic surface of the metallic thin film is etched by contacting it with an effective quantity of a β-diketone, or the like, that has been dispersed in an atmosphere that allows oxidation, and under conditions in which a volatile metal-ligand complex can form, and then volatilizing the metal-ligand complex. Copper may also be included in the metal that is etched. An embodiment is shown in which oxygen ($O_2$) is used to oxidize the metal and hexafluoroacetylacetone is used as the β-diketone.

Reference 2 describes an example in which $H_2O_2$ is used to oxidize metallic copper. Hexafluoroacetylacetone is used to complex the copper oxide.

Reference 3 describes an example in which $O_2$ remote plasma is used to oxidize metallic copper. Hexafluoroacetylacetone is used to complex the copper oxide.

Reference 4 discloses a cleaning method for metallic copper as an example of a metallic copper etching technique involving the use of an oxidizing atmosphere and hexafluoroacetylacetone, which is a type of β-diketone.

As mentioned above, chemical gas phase etching methods that use $H_2O_2$, $O_2$, remote plasma, or $O_2$ to oxidize metallic copper are already known. It is also known that hexafluoroacetylacetone (1,1,1,5,5,5-hexafluoro-2,4-pentanedione), which is a type of β-diketone, is widely used as a source material for complexing copper oxide.

When a process to deposit a metallic copper film on the surface of a substrate in thin film deposition apparatus is successively repeated while the substrates are replaced, a film of metallic copper builds up within the thin film deposition apparatus. When the film that has built up within the thin film deposition apparatus becomes thick, it causes problems with the deposition process, such as degradation of the films, and it is thus necessary to perform a cleaning process at suitable intervals to remove the built-up film.

However, the conventional methods mentioned in the above references are mainly concerned with the removal of thin copper films from substrates, and no cleaning methods have been proposed for the removal of metallic copper films that have built up within thin film deposition apparatus.

The present inventors have therefore tried to apply the chemical gas phase etching method mentioned in reference 1 for the removal of metallic copper built up within thin film deposition apparatus. That is, based on the chemical gas phase etching method of reference 1, copper oxide was produced by using oxygen to oxidize the metallic copper, a copper complex was produced by using hexafluoroacetylacetone to complex the copper oxide, and this copper complex was sublimated. However, with a chemical gas phase etching method based on the method mentioned in reference 1, the built-up metallic copper film became spongy (porous) and could not be neatly removed. Instead, problems occurred such as particulates or cavities forming in the lower surface of the built-up film, resulting in cracks in and flaking of the built-up film. The appearance of a built-up film that has become spongy is depicted in the photos of FIGS. 3 and 4, and the appearance of the flakiness is depicted in the photos of FIGS. 5 and 6.

As mentioned above, it has not been possible to use conventional chemical gas phase etching methods to neatly remove a film of metallic copper that has built up within this film deposition apparatus. Another paper (Mark A. George, Alan J. Kobar, Scott E. Beck, Jen Waskiewcz, Ron M. Pearlstein and David A. Bohling, "Chemical Vapor Etching of Copper for Cu CVD Chamber Cleaning," *Advanced Metallization and Interconnect Systems for ULSI Applications in* 1997, U.S. Session (Sep. 30, 1997)) regarding the results of research into cleaning methods for the removal of metallic copper built up within thin film deposition apparatus was also published very recently.

The present invention aims to solve the above mentioned problems and provides a cleaning method that can neatly remove metallic films of metallic copper or the like that have built up within thin film deposition apparatus without generating particulates or flakiness.

OBJECTS AND SUMMARY OF THE INVENTION

To achieve the above mentioned aim, the method of cleaning metallic films built up within thin film deposition apparatus relating to the present invention is constituted as follows.

The cleaning method relating to the present invention presumes the availability of thin film deposition apparatus for depositing a film on the surface of a substrate. The method is constituted so as to remove a metallic film that has built up within the thin film deposition apparatus during deposition by cleaning process comprising an oxidation step to oxidize this metallic film and produce a film of the oxide thereof, a complexing step to complex the oxide film and produce a complex thereof, and a sublimation step to sublimate the complex.

According to one aspect of the cleaning method having the above configuration, the conditions of the cleaning process is set so that the oxidation step is the rate-determining step.

The cleaning method may also be characterized in that the above mentioned metallic film is metallic copper, copper oxide is produced in the oxidation step, and the copper oxide is complexed in the complexing step to produce a copper complex, and furthermore in that the conditions of the cleaning process is set so that the oxidation step is the rate-determining step.

The cleaning method may also be characterized in that, in the above mentioned method, the conditions of the cleaning process whereby the oxidation step is the rate-determining step is set by producing an atmosphere that allows complexing, and then producing an atmosphere that allows oxidation.

The cleaning method may also be characterized in that, in the above mentioned method, the conditions of the cleaning process whereby the oxidation step is the rate-determining step is set by simultaneously producing an atmosphere that allows complexing and an atmosphere that allows oxidation.

The cleaning method may also be characterized in that, in the above mentioned method, the complex is a complex produced using a β-diketone.

The cleaning method may also be characterized in that, in the above mentioned method, the atmosphere that allows oxidation is produced by introducing oxygen into the thin film deposition apparatus.

The cleaning method may also be characterized in that, in the above mentioned method, the atmosphere that allows complexing is produced by introducing a β-diketone into the thin film deposition apparatus.

The cleaning method may also be characterized in that, in the above mentioned method, hexafluoroacetylacetone is used as the β-diketone.

The cleaning method may also be characterized in that, in the above mentioned method, the reaction of the oxidation step is not allowed to run in excess of the reaction of the complexing step. Although the magnitude of the reaction rate of the complexing step is determined by the production rate of copper oxide produced by the oxidation step, it is preferable that the reaction of the oxidation step does not run to excess so that the oxidation step on which the complexing step is based is the rate-determining step.

The cleaning method may also be characterized in that, in the above mentioned method, the pumping speed is intermittently varied during the cleaning process.

The cleaning method may also be characterized in that, in the above mentioned method, the thin film deposition apparatus is a CVD film deposition device equipped with a horn stream structure gas inlet guide in the space at the front surface of the substrate, and in that the metallic copper removed is metallic copper that has built up mainly on the surface of the gas inlet guide facing toward the substrate.

The cleaning method may also be characterized in that, in the above mentioned method, when the atmosphere that allows oxidation in the oxidation step is produced with oxygen and the atmosphere that allows complexing in the complexing step is produced with a β-diketone, the temperature inside the thin film deposition apparatus during the cleaning process is in the range from 100° C. to 400° C. and the pressure inside the thin film deposition apparatus is such that the partial pressure of oxygen is from 100 mTorr to 300 Torr during the cleaning process.

The cleaning method may also be characterized in that, in the above mentioned method, when the atmosphere that allows oxidation in the oxidation step is produced with oxygen and the atmosphere that allows complexing in the complexing step is produced with a β-diketone, the flow rate of oxygen gas inside the thin film deposition apparatus is up to 5 times the flow rate of the β-diketone when expressed as a molar ratio.

DETAILED DESCRIPTION OF THE PREFERRED EMBODIMENTS

Figure 1:
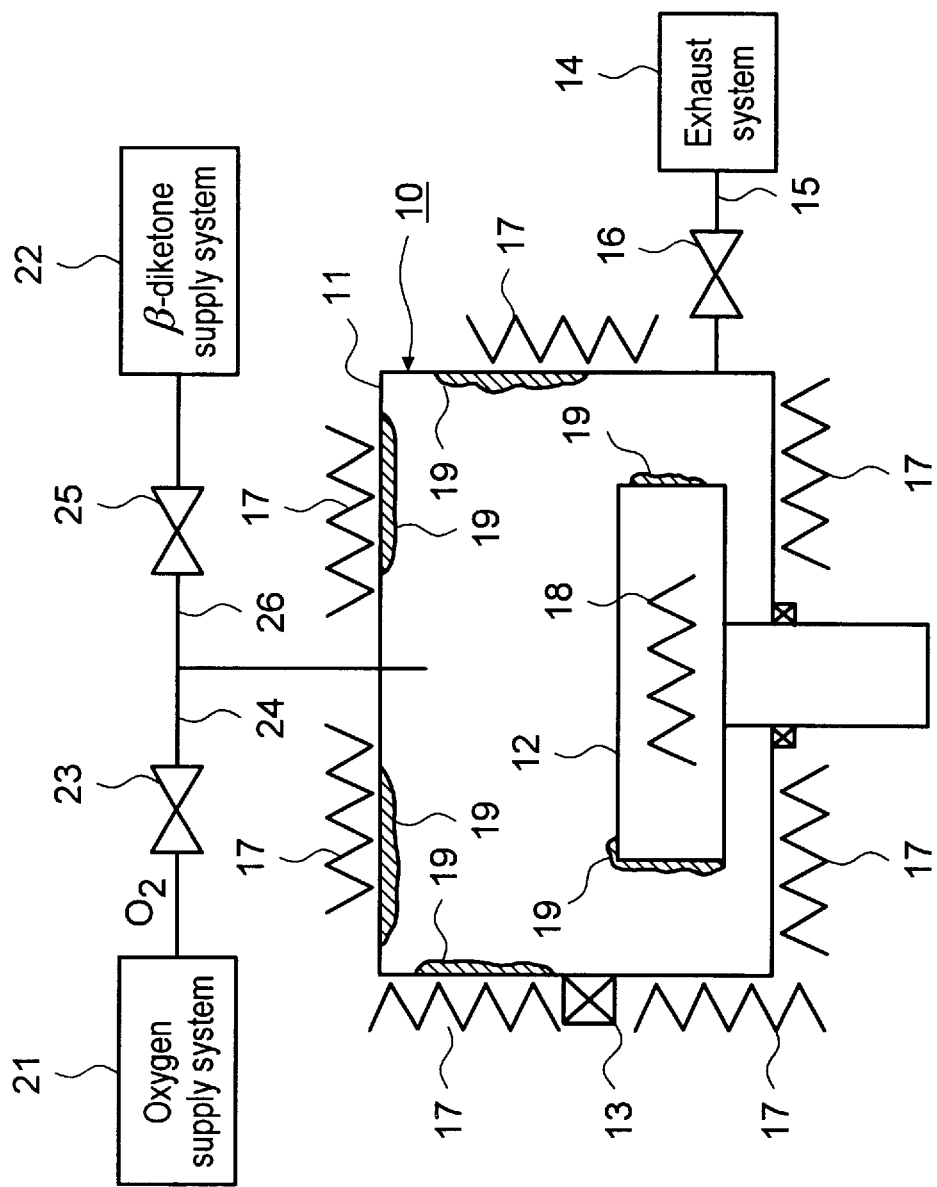
FIG. 1 is a schematic view showing a typical configuration of thin film deposition apparatus to which a cleaning method relating to the present invention is applied.

FIG. 1 is a schematic view of a thin film deposition apparatus 10 in which a cleaning method relating to the present invention has been implemented. In this thin film deposition apparatus 10, a substrate holder 12 is provided in the lower part of the interior of vacuum chamber 11. During deposition, the substrate on which deposition is to be performed is mounted on substrate holder 12. A gate valve 13 for the removal and insertion of substrates and a exhaust system 14 which establishes the necessary vacuum conditions inside vacuum chamber 11 are provided in the side wall, for example, of vacuum chamber 11. A main valve 16 is fitted in the duct 15 which connects the exhaust system 14 with vacuum chamber 11.

Heaters 17 are disposed outside the side wall, cover plate and base plate of vacuum chamber 11. Heaters 17 keep vacuum chamber 11 at the prescribed temperature. A heater 18 is also set inside substrate holder 12 to keep substrate holder 12 and the substrate at the prescribed temperature. The power source for supplying heating power to heaters 17 and 18 and the sensor unit for temperature-sensing are omitted from the figure.

Vacuum chamber 11 is the essential constituent of the thin film deposition device which deposits a film of a metal such as metallic copper on the surface of a substrate. Any deposition technique such as sputtering or CVD can be applied. During deposition, the substrate is brought in through gate valve 13 and mounted on substrate holder 12. After that, exhaust system 14 holds the interior of vacuum chamber 11 at the necessary low pressure state suitable for deposition. In this state, thin film deposition is performed on the surface of the substrate. Deposition on the substrate can be performed sequentially on a plurality of substrates by single-substrate processing, for example. In practice, the deposition apparatus components needed for this film deposition technique are added to vacuum chamber 11. In the case of sputtering, it is fitted with parts such as a target and electrodes for generating plasma, and in the case of CVD it is fitted with a configuration for introducing the reaction gases and the like and starting the chemical reaction. In the thin film deposition apparatus of FIG. 1, the constituent parts relating to film deposition are not illustrated.

The present embodiment will chiefly describe cleaning process for removing a built-up metallic film 19 of metallic copper or the like that has built up within (e.g., on the vacuum chamber wall surfaces, lines and around the substrate holder) vacuum chamber 11 as a result of successive depositions on substrates in thin film deposition apparatus 10. In this cleaning method, chemical gas phase etching is used to remove the built-up film 19. Note that although FIG. 1 shows the built-up film 19 attached to a part of the interior of vacuum chamber 11 and substrate holder 12, the built-up film actually builds up on the inner surface of vacuum chamber 11, the outer surface of substrate holder 12, and on the equipment inside vacuum chamber 11.

As an apparatus for implementing cleaning process based on chemical gas phase etching relating to the present mode of implementation, vacuum chamber 11 is provided with an oxygen supply system 21 and a β-diketone supply system 22. The oxygen supply system 21 is connected to vacuum chamber 11 by a line 24 via a valve 23, and the β-diketone supply system 22 is connected to vacuum chamber 11 by a line 26 via a valve 25. In the β-diketone supply system 22, the β-diketone is vaporized by bubbling nitrogen ($N_2$) through it, for example. Other methods for vaporizing the β-diketone include using a vaporizer to vaporize the liquid (Measurement Technology, *Keisoku Gijutsu* '97, Vol. 10, p. 21–24), or warming a vessel filled with β-diketone to a constant-temperature state from the outside with a heating mechanism such as a chiller (as in FIG. 2). In this way, vaporized β-diketone is introduced into vacuum chamber 11. When the cleaning process is performed in this sort of configuration, oxygen ($O_2$) and β-diketone are introduced into vacuum chamber 11 so as to satisfy suitable cleaning criteria which are discussed below. Here, hexafluoroacetylacetone is the most preferable β-diketone.

When using chemical gas phase etching to implement the cleaning process relating to the present mode of implementation in thin film deposition apparatus 10, it is preferably set so that the following cleaning process conditions are met in order that the metallic copper film 19 that has built up inside is progressively and uniformly etched from the surface thereof. The cleaning process conditions are described in Embodiments 1 and 2 below.

Embodiment 1

Film deposition (metallic copper) is performed successively on a plurality of substrates in thin film deposition apparatus 10. Once the last wafer has been completed, gate valve 13 of vacuum chamber 11 is opened and the wafer is taken out. In this state, the metallic copper film 19 has built up to a depth of about 2 μm inside vacuum chamber 11. Next, gate valve 13 is closed, the temperature of vacuum chamber 11, substrate holder 12 and the like is held at preferably 210 C. by heaters 17 and 18, and the interior of vacuum chamber 11 is kept under high vacuum conditions by opening main valve 16 and operating exhaust system 14. Main valve 16 is then closed.

In the above state, valve 25 is first opened to introduce vaporized β-diketone into vacuum chamber 11. Here, hexafluoroacetylacetone (Hhfac) was used as the β-diketone. At this time, the flow rate of the $N_2$ used for bubbling was 140 sccm, and the flow rate of hexafluoroacetylacetone was 40 sccm.

Three minutes after the β-diketone has been introduced into vacuum chamber 11 and the pressure inside has reached about 20 Torr, valve 23 is opened and oxygen is introduced inside vacuum chamber 11 at a flow rate of 20 sccm. After that, main valve 16 is opened and the pressure inside vacuum chamber 11 is controlled to 20 Torr by exhaust system 14. When the oxygen is introduced into vacuum chamber 11, the β-diketone has been fully introduced into vacuum chamber 11.

Four minutes after introducing the oxygen, valves 23 and 25 are closed, and the introduction of β-diketone (hexafluoroacetylacetone) and oxygen is stopped. The pressure inside vacuum chamber 11 is controlled to the preferred pressure state by controlling the pumping operation of exhaust system 14. As a result of the above, it was confirmed that the metallic copper film 19 that had built up within vacuum chamber 11 had been completely removed. This completes the cleaning process.

The above cleaning process will be explained from the viewpoint of the operating procedure. It is assumed that operations such as the heating operations of heaters 17 and 19, the operations to evacuate the interior of vacuum chamber 11 by exhaust system 14 with main valve 16 left open, the introduction of β-diketone by opening valve 25, and the introduction of oxygen by opening valve 23 are performed in accordance with a controller, which is not illustrated.

A sufficient quantity of β-diketone has preferably been supplied into vacuum chamber 11 at the step when the oxygen is introduced into vacuum chamber 11. This results in the cleaning conditions being set such that the step whereby the metallic copper is oxidized by the oxygen is the rate-determining step.

Next, the above cleaning process is explained from the microscopic viewpoint of the chemical reactions involved. The metallic copper cleaning process using the above mentioned chemical gas phase etching method can be seen to comprise a metallic copper oxidation step, a copper oxide complexing step, and a copper complex sublimation step. Expressed as chemical formulae, these steps are as follows:

Chemical Formula 1:

Oxidation step:

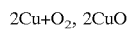

$2Cu + O_2, 2CuO$

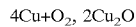

$4Cu + O_2, 2Cu_2O$

Chemical Formula 2:

Complexing step:

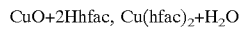

$CuO + 2Hhfac, Cu(hfac)_2 + H_2O$

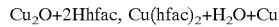

$Cu_2O + 2Hhfac, Cu(hfac)_2 + H_2O + Cu$

Sublimation step:

Sublimation of $Cu(hfac)_2$ surface build-up.

In the above, the chemical reactions take place with the metallic copper oxidation step followed by the copper oxide complexing step, and then by the copper complex sublimation step. To put it another way, the above mentioned cleaning process presumes that the complexing step is preceded by an oxidation step, and that the sublimation step is preceded by a complexing step. With a cleaning method according to Embodiment 1, by setting the conditions so that the step in which the metallic copper is oxidized with oxygen is the rate-determining step, it is possible to promote the complexing step and sublimation step, and to smoothly etch the surface of the built-up copper film from the interior of the vacuum chamber. Here, the "step in which the metallic copper is oxidized with oxygen is the rate-determining step" means that of the chemical reactions in the above mentioned three steps, the chemical reaction of the oxidation step proceeds at the slowest rate. The reaction rate of the oxidation step determines the reaction rate of the complexing step and the reaction rate of the sublimation step, thereby determining the reaction rate of the cleaning process as a whole. In other words, the cleaning method used for gas phase etching relating to the present invention can be said to set the cleaning conditions such that the reaction of the metallic copper oxidation step does not run in excess of the reaction of the complexing step.

According to the operating procedure of the aforementioned cleaning process, at the step prior to the introduction of oxygen into vacuum chamber 11, i.e., at the step prior to the production of an atmosphere that allows oxidation inside vacuum chamber 11, an atmosphere that allows complexing is made sufficiently inside the vacuum chamber 11. Once the oxygen has introduced to oxidize the metallic copper, the complexing step and sublimation steps proceed straight away and the copper complex is pumped out. Accordingly, the reaction of the metallic copper oxidation step does not run in excess of the reaction of the complexing step, but instead this oxidation step becomes the rate-determining step.

With a cleaning method according to Embodiment 1 as described above, since the conditions are set such that the step whereby the metallic copper is oxidized with oxygen becomes the rate-determining step, the film of metallic copper that has built up within vacuum chamber 11 can be removed smoothly from its surface.

Next, the pumping operations in the above cleaning process is described. In the cleaning process, the pumping operations of exhaust system 14 are suitably controlled. Preferably, by intermittently varying the pumping performance inside vacuum chamber 11, the sublimation step and the like are made to proceed more effectively, the rate of removal of the complex from the built-up film is increased, and the efficiency of the cleaning process is increased.

In the above mentioned cleaning process, the removal efficiency can decrease for the following two reasons. The first is that as time passes during the cleaning process, there is a danger that the sublimation rate may fall off due to an increase in the partial pressure of the complex gas near the surface of the built-up metallic copper, with the sublimation step becoming the rate-determining step as a result. The second is that, in the same way, the partial pressure of the complex gas increases near the surface of the built-up metallic copper as time passes, so there is a danger that the partial pressure of oxygen may decrease near the surface of the copper and the oxidation rate of the metallic copper can become too low.

The first of the above reasons is discussed in the following. When the pumping speed is reduced with the intention of keeping the internal pressure high with the same flow rate of gas introduced into the vacuum chamber, the reaction products are pumped out less and spend longer inside the vacuum chamber, under which conditions (when the pumping speed is too slow) the proportion of reaction products inside the vacuum chamber increases with time. This means that the partial pressure of the reaction products increases, and the sublimation rate becomes the rate-determining step.

This is explained in further detail in the following. The ideal case is one in which the gases introduced into the vacuum chamber flow in such a way as to expel the gases present up to that point without residing within the vacuum chamber. First, it will be assumed that the pressure inside the vacuum chamber is 20 Torr and that it is filled with a certain gas A. At this time, a different type of gas B is allowed to flow in at a rate of 200 sccm and the pumping speed is set to 0.1 l (liters) per second so as to maintain a pressure of 20 Torr, in which case the time needed to change over from gas A to gas B inside the vacuum chamber is about 3 minutes. On the other hand, when the vacuum chamber is filled with a certain gas A to a pressure of 200 Torr, a different type of gas B is allowed to flow in at a rate of 200 sccm, and the pumping speed is set to 0.01 (liters) per second so as to maintain a pressure of 200 Torr, the time needed to change over from gas A to gas B inside the vacuum chamber is about 30 minutes. That is, about 10 times as much time is needed in the latter case.

Viewed in terms of the aforementioned embodiment, the above example is the same as the gradual increase in the partial pressure of $Cu(hfac)_2$ inside the vacuum chamber, which initially contained an atmosphere of $N_2$ and Hhfac. Then, after a certain time period, the partial pressure of $Cu(hfac)_2$ inside the vacuum chamber becomes the same as the saturated vapor pressure of $Cu(hfac)_2$, at which point the sublimation step becomes the rate-determining step. That is, it seems that when the relationship (amount of copper complex gas pumped out)<(amount of copper complex gas produced by chemical gas phase etching) holds, the partial pressure of $Cu(hfac)_2$ gradually increases with time, the amount of copper complex gas produced by chemical gas phase etching is eventually unable to exceed the amount of copper complex gas pumped out, the sublimation rate slows down, and finally the sublimation step becomes rate-determining such that (amount of copper complex gas pumped out)=(amount of copper complex gas produced by chemical gas phase etching). For such reasons, the pumping is performed with a varied pumping performance, preferably with a pumping speed that is varied intermittently.

The second of the above reasons is discussed in the following. As the cleaning process proceeds, the gas in the vicinity of the built-up metallic copper contains an increased proportion of copper complex gas or $H_2O$ gas, which is a product of the reaction, the proportion of oxygen gradually decreases, and the oxidation rate of the metallic copper decreases due to the reduced partial pressure of oxygen. When the oxidation step is the rate-determining step, the removal rate, i.e., the metallic copper oxidation rate R is expressed by the formula $R=K\times[P_{O2}]^n\times[Cu]$ (where K is a reaction rate constant, $[P_{O2}]$ is the oxygen density in the vicinity of the surface, n is a multiplier (1), and [Cu] is the amount of Cu that can react with the $O_2$ or the surface area of the Cu).

As the formula clearly shows, the metallic copper oxidation rate decreases as the partial pressure of oxygen decreases. Furthermore, as time passes, the partial pressure of the copper complex gas increases in the vicinity of the surface of the built-up metallic copper, whereby the amount of Cu that can react with the $O_2$, i.e., a quantity proportional to the surface area of the Cu, decreases slightly. The formula clearly shows that the metallic copper oxidation rate is proportional to the surface area of Cu, and so the metallic copper oxidation rate decreases due to the increased partial pressure of copper complex gas in the vicinity of the surface of the built-up metallic copper. Therefore, when a thin copper film of, for example, 10 μm or more is removed, the oxidation step is promoted by performing intermittent pumping.

Correction of the pressure inside vacuum chamber 11 based on intermittent pumping is performed by changing the conductance of the duct in exhaust system 14 to change the pumping speed. For example, in Embodiment 1 above, when $N_2$ (140 sccm), β-diketone (40 sccm) and oxygen (20 sccm) are simultaneously introduced into vacuum chamber 11 and the pressure inside vacuum chamber 11 is held at 20 Torr, the conductance is held at roughly 0.1 l (liters) per second. Similarly, when $N_2$ (140 sccm), β-diketone (40 sccm) and oxygen (20 sccm) are simultaneously introduced into vacuum chamber 11 and the pressure inside vacuum chamber 11 is held at 200 Torr, the conductance is held at roughly 0.01 l (liters) per second. At this time, a dry pump is used for vacuum pumping. A dry pump has a large nominal pumping speed of 1000 l/sec, which does not present any problems in terms of conductance.

When the pumping speed is changed and the vacuum chamber is pumped out to a high vacuum, the conductance of the exhaust system duct is increased. When the vacuum chamber is pumped out to a high vacuum while the cleaning process is performed as in Embodiment 1 above, the conductance is about 50 l/sec. By closing valves 23 and 25 and increasing the above mentioned conductance to 50 l/sec, it was possible to bring the interior of vacuum chamber 11 to within $1 \times 10^{-2}$ Torr within 30 seconds.

Next, the temperature conditions, oxygen partial pressure conditions, and the conditions for the relationship between the oxygen and β-diketone flow rates in the cleaning method of Embodiment 1 are described. The temperature conditions, oxygen partial pressure conditions, and the conditions for the relationship between the oxygen and β-diketone flow rates are set as follows.

The temperature was set in the range from 100° C. to 400° C. With a temperature of less than 100° C., the oxidation step, complexing step and sublimation step do not proceed at practicable rates, and above 400° C. the β-diketone is oxidized and decomposes. The temperature range is preferably from 190° C. to 310° C., at which removal rates of 5000 Angstroms per second or greater can be achieved, and is more preferably from 210° C. to 230° C.

The pressure is set so that the partial pressure of oxygen is in the range from 100 mTorr to 300 Torr. With an oxygen partial pressure of less than 100 mTorr, the oxidation step, complexing step and sublimation step do not proceed at practicable rates, and above 300 Torr the oxidation step does not become the rate-determining step. The oxygen partial pressure range is preferably from 1 Torr to 200 Torr, at which the removal rate can be set to 5000 Angstroms per second or greater, and more preferably the oxygen partial pressure is 2 Torr.

The relationship between the oxygen and β-diketone flow rates is preferably that the oxygen flow rate in vacuum chamber 11 does not exceed 5 times the β-diketone flow rate expressed as a molar ratio. In particular, when a removal rate of 5000 Angstroms per second or greater is to be achieved, the oxygen flow rate is preferably half the β-diketone flow rate expressed as a molar ratio.

Embodiment 2

In the cleaning method of Embodiment 1 mentioned above, the β-diketone is first introduced into the vacuum chamber to produce an atmosphere that allows complexing, after which oxygen is introduced to produce an atmosphere that allows oxidation; however, this embodiment is configured in such a way that the β-diketone and oxygen are introduced simultaneously into the vacuum chamber so as to simultaneously produce an atmosphere that allows complexing and an atmosphere that allows oxidation. Even though an atmosphere that allows complexing and an atmosphere that allows oxidation are produced simultaneously, it is still possible to set the above mentioned cleaning conditions such that the oxidation step is the rate-determining step and to clean away the built-up film of metallic copper smoothly.

Figure 2:
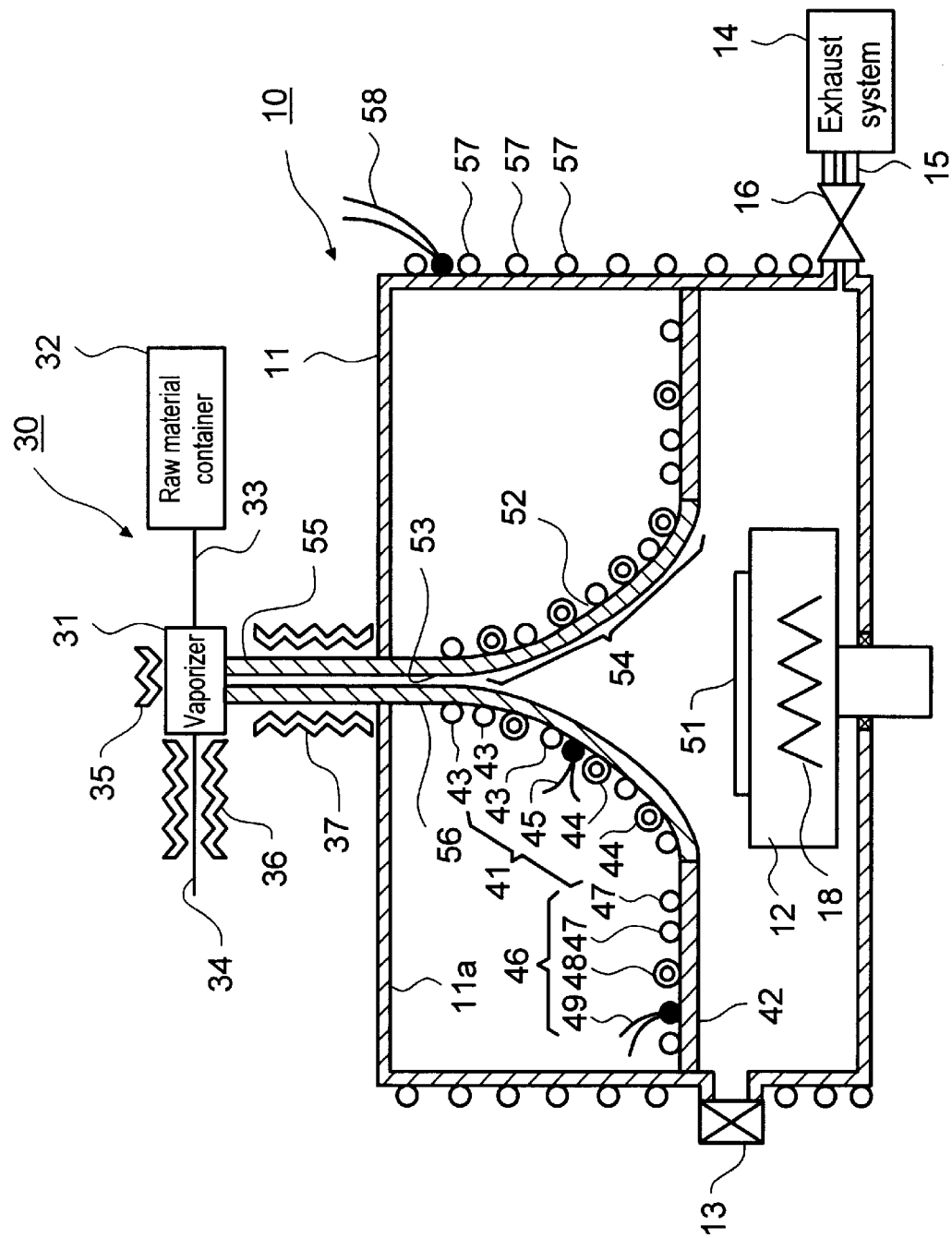
FIG. 2 is a vertical cross section showing a specific example of the interior of the thin film deposition apparatus.
Figure 3:
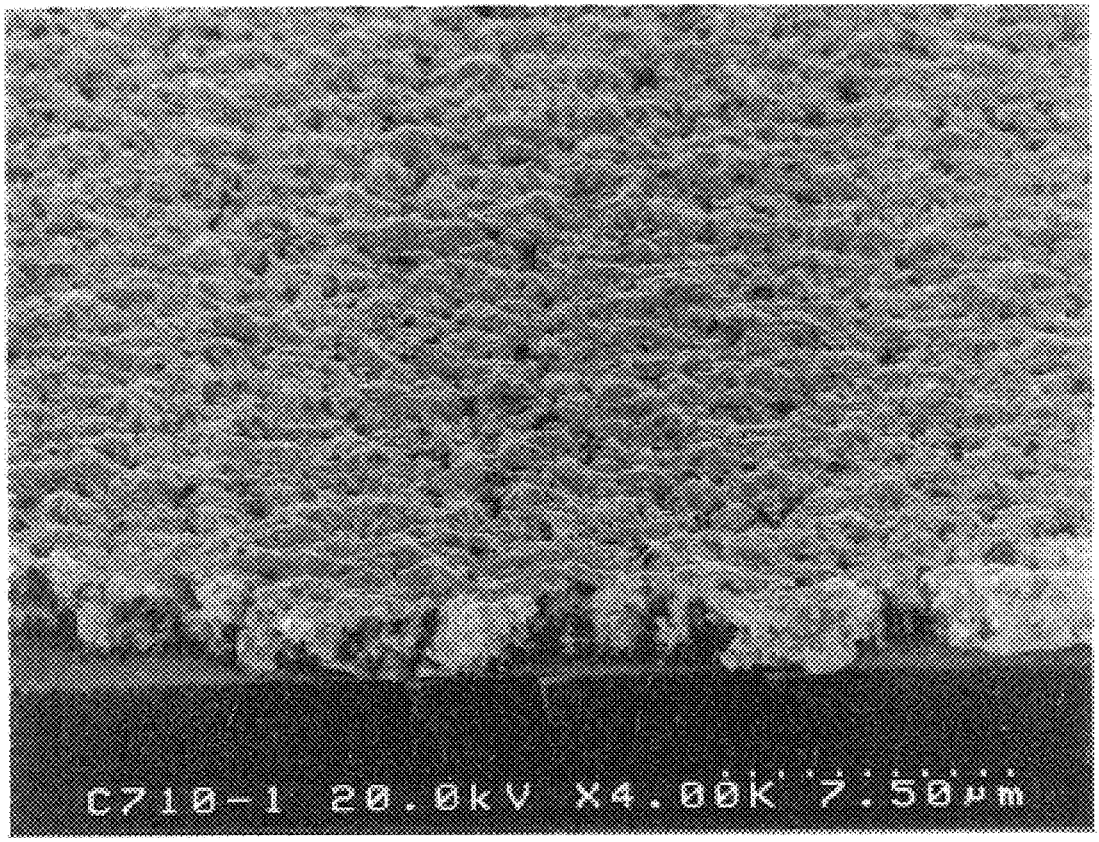
FIG. 3 is a photograph of a first example of a thin film that has become spongy.
Figure 4:
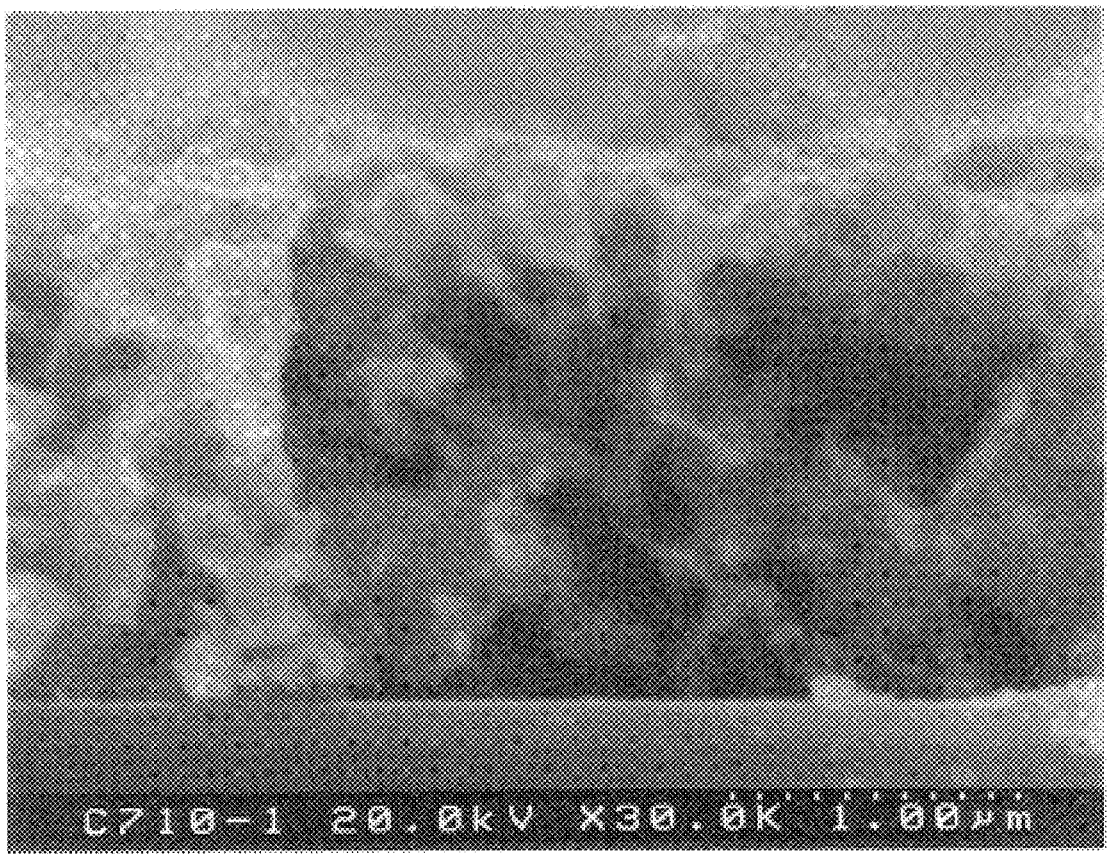
FIG. 4 is a photograph showing an enlarged cross section of a thin film that has become spongy.
Figure 5:
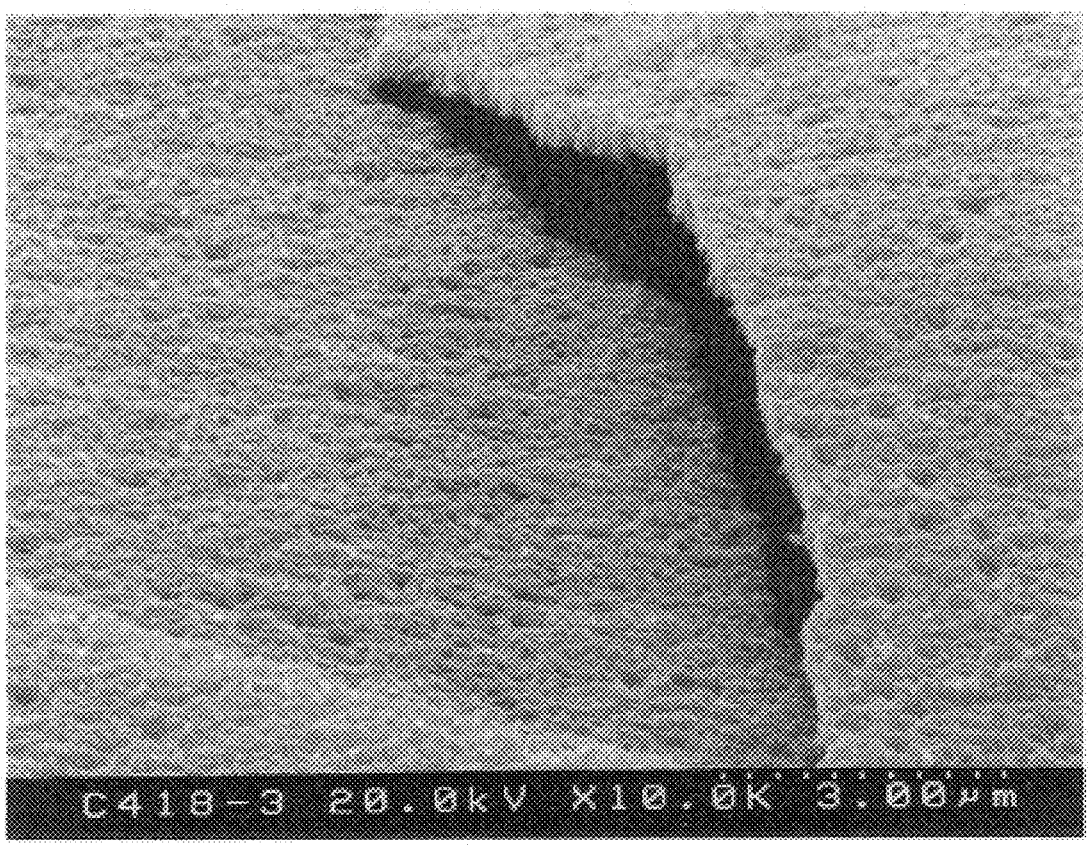
FIG. 5 is a photograph showing the outward appearance of a thin film in which cracks have occurred.
Figure 6:
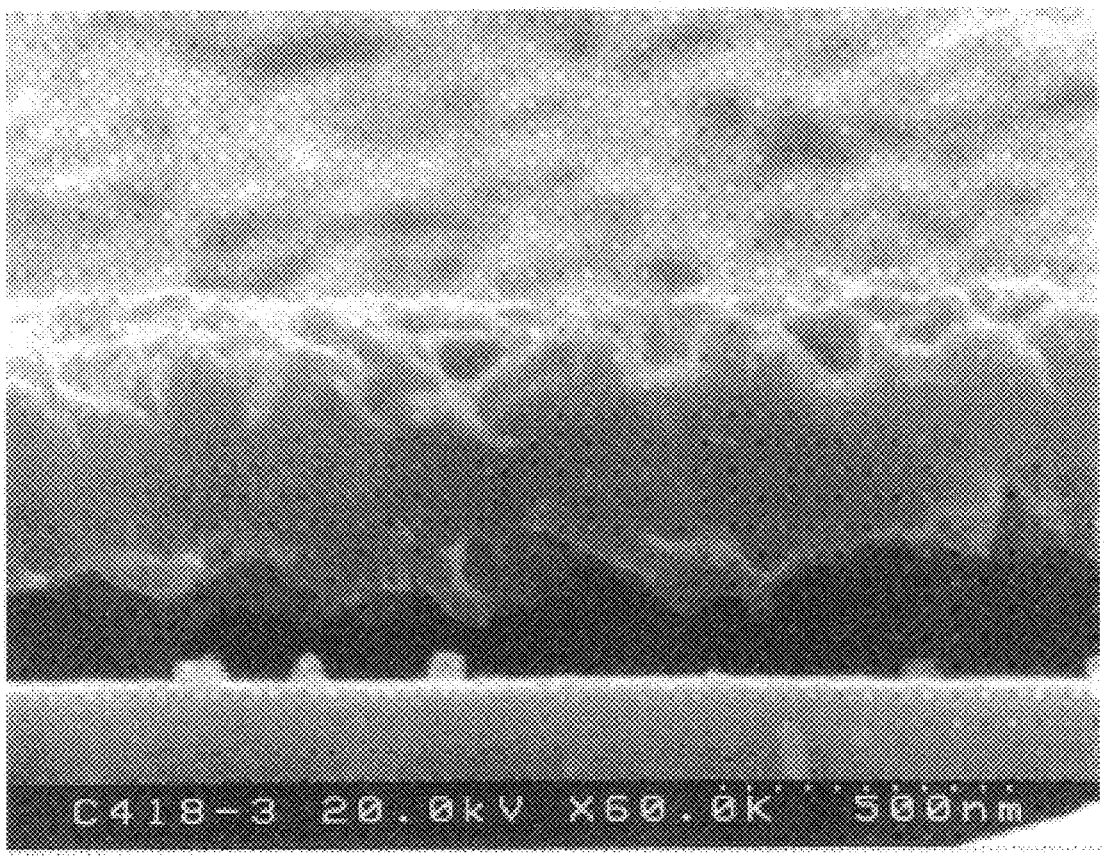
FIG. 6 is a photograph showing an enlarged cross section of the interior of a thin film in which cracks have occurred.

A specific example of thin film deposition apparatus relating to the present invention is described with reference to FIG. 2. This thin film deposition apparatus is a CVD apparatus. In FIG. 2, elements that are essentially the same as elements described in FIG. 1 are given the same reference numerals.

In the CVD apparatus, vacuum chamber 11 is equipped with an exhaust system 14, a duct 15, a main valve 16 and a gate valve 13, and a substrate 51 is disposed on substrate holder 12. A heater 18 is provided inside substrate holder 12. A gas inlet guide 52 is mounted in the space at the front surface of the substrate, facing toward the surface (deposition surface) of the substrate 51 on substrate holder 12 inside vacuum chamber 11. Gas inlet guide 52 has a gas inlet port 53 at the end nearest the cover plate of vacuum chamber 11, and has a gas rectifier area 54 in the section below gas inlet port 53. Gas inlet port 53 is positioned more or less at the center of gas rectifier area 54 when gas inlet guide 52 is viewed from the side of substrate 51, and is disposed so as to be concentric with the central axis of substrate 51. Gas rectifier area 54 faces the film deposition surface of substrate 51, and the surface area of the opening of gas rectifier area 54 (the surface area of the open part in a horizontal cross section) is formed so as to gradually increase the closer it gets to substrate 51. In the example illustrated, the part of gas inlet guide 52 that projects down from gas inlet port 53 toward the opening at the bottom has an opening part that gradually expands like the horn of a musical instrument, thereby forming the above mentioned gas rectification unit 54. The section of gas rectifier area 54 can also have an opening surface area that expands in a stepwise fashion. The horn shape of gas rectifier area 54 of gas inlet guide 52 can also have a shape wherein the distance from the substrate gets narrower gradually or in a stepwise fashion along the way from the center to the circumference according to its relationship with the flow rate of the gas flowing along the surface of the substrate. A detailed description of the structure and action of a gas inlet guide 52 having this sort of horn stream structure can be found in Japanese Patent Application No. H8-231513.

A gas inlet line 55 is attached to the cover plate 11a of vacuum chamber 11. To the base end of gas inlet line 55 is connected the vaporizer 31 of a source material gas supply system 30 which supplies source material gas to the surface of substrate 51, and the above mentioned gas inlet port 53 is connected via an inlet joint 56 to the other end of gas inlet line 55. As the source material gas is supplied from source material gas supply system 30 to the space in front of substrate 51 via gas inlet line 55, gas inlet guide 52 and so on, a chemical reaction is induced in the source material gas at the surface of substrate 51, which is heated by heater 18, and in the vicinity of this surface, whereby a thin film is deposited on the surface of the substrate.

The above mentioned vacuum chamber 11 is made from, for example, stainless steel or aluminum alloy. A temperature control mechanism is fitted inside vacuum chamber 11; this temperature control mechanism consists of a heater 57, a temperature sensor 58 and the like. The temperature of vacuum chamber 11 is held at about 60° C.

Raw material gas supply system 30 vaporizes the liquid source material and supplies the gaseous source material to the space in front of substrate 51. Source material gas supply system 30 consists of source material container 32 filled with liquid source material, and the above mentioned vaporizer 31 which vaporizes the liquid source material conveyed from source material container 32. The gas inlet line 55, which guides the source material vaporized by vaporizer 31 into vacuum chamber 11, and the gas inlet guide 52 connected to gas inlet line 55 can also be regarded as being part of the source material gas supply system 30. The source material container 32 and vaporizer 31 are connected by a liquid transport line 33, and a flow regulator or the like (not illustrated) which regulates the flow rate of source material is fitted in liquid transport line 33.

A line 34 for the introduction of a carrier gas such as hydrogen gas, helium gas or nitrogen gas is fitted to vaporizer 31. Line 34 is fitted with a carrier gas flow regulator (not illustrated) which regulates the carrier gas flow rate. Vaporizer 31 has a structure that facilitates mixing of the source material gas and carrier gas. As mentioned above, a gas inlet line 55 which introduces the vaporized source material and carrier gas into the vacuum chamber is connected to vaporizer 31. Furthermore, vaporizer 31 is fitted with a temperature control mechanism 35 that controls its temperature to the prescribed temperature, line 34 is fitted with a temperature control mechanism 36 that controls its temperature to the prescribed temperature, and gas inlet line 33 is fitted with a temperature control mechanism 37 that controls its temperature to the prescribed temperature. In this embodiment, the vaporizer 31, line 34 and gas inlet line 55 are each held at a temperature of about 50° C., for example.

Gas inlet guide 52 is provided with a guide temperature control mechanism 41 that suitably controls the temperature thereof. Furthermore, a gas inlet guide attachment mechanism 42 which supports and fixes gas inlet guide 52 at the prescribed position inside vacuum chamber 11 is disposed around this gas inlet guide 52.

Guide temperature control mechanism 41 consists of a heater 43 provided in a state of contact with the rear surface of a section of gas inlet guide 52 facing toward substrate 51, a coolant circulation path 44 for cooling the gas inlet guide which is provided in a state of contact with the same rear surface, a temperature sensor 45 which senses the temperature of gas inlet guide 52, and a controller (not illustrated) which controls the temperature and flow rate of the coolant flowing through coolant path 44 and the amount of heat from heater 43 according to the signal from temperature sensor 45.

Gas inlet guide attachment mechanism 42 is a ring-shaped plate made of alumina, for example, which extends out from the circumference of the lower part of gas inlet guide 52 parallel to substrate 51 and whose outer edge is attached to the inner surface of vacuum chamber 11. Gas inlet guide attachment mechanism 42 is equipped with a temperature control mechanism 46 for holding it at the same temperature as vacuum chamber 11. This temperature control mechanism 46 consists of a heater 47 which heats the gas inlet guide attachment mechanism 42, a coolant circulation path 48 through which a coolant flows for cooling the gas inlet guide attachment mechanism 42, a temperature sensor 49 which measures the temperature of gas inlet guide attachment mechanism 42, and a control mechanism (not illustrated) which controls the temperature and flow rate of the coolant flowing through coolant circulation path 48 and the amount of heat from heater 47 according to the sensed signal from temperature sensor 49.

Also, the above mentioned gas inlet joint 56 fitted to gas inlet port 53 is preferably made of a resin with superior heat resistance and low thermal conductivity, and acts so as to suppress the conduction of heat from gas inlet guide 52 to gas inlet line 55 and vacuum chamber 11.

The above mentioned thin film deposition apparatus 10 is also fitted with the aforementioned oxygen supply system 21, β-diketone supply system 22, and valves 23 and 25, and is additionally fitted with a control mechanism for implementing the cleaning method relating to the present invention; all of which are not shown in FIG. 2.

In the above mentioned thin film deposition apparatus 10, films are liable to build up mainly on the surface of gas inlet guide 52 facing toward the substrate. Therefore, the aforementioned cleaning method is implemented in vacuum chamber 11 at suitable intervals.

With the present invention, as the foregoing description has shown, since the cleaning conditions are set such that the oxidation step is the rate-determining step, a film that has built up within the thin film deposition apparatus can be removed smoothly from its surface without leaving a residue of copper oxide or the like.

What is claimed is:

1. A method of cleaning metallic films built up within a thin film deposition apparatus, said method comprising the steps of:

(a) introducing a β-diketone into a thin film deposition apparatus having an exhaust system;

(b) then introducing oxygen, along with the β-diketone, into the thin film deposition apparatus at a flow rate of up to 5 times the flow rate of the β-diketone when expressed as a molar ratio and at conditions effective to oxidize the metallic film to produce a film of oxide thereof, to complex the oxide film with the β-diketone, and to sublimate the complex; and (c) intermittently varying the pumping speed of the exhaust system such that oxidation of the metallic film is the rate-determining step.

2. The method according to claim 1, wherein the β-diketone is hexafluoroacetylacetone.

3. The method according to claim 1, wherein the temperature inside the thin film deposition apparatus during steps (a) through (c) ranges from 100 to 400° C., and the pressure inside the thin film deposition apparatus is such that the partial pressure of oxygen is from 100 mTorr to 300 Torr during steps (a) through (c).

4. The method according to claim 1, wherein the metallic film is copper.

5. A method of cleaning metallic films built up within a thin film deposition apparatus, said method comprising the steps of:

(a) simultaneously introducing oxygen and β-diketone into a thin film deposition apparatus having an exhaust system, wherein said oxygen is introduced at a flow rate of up to 5 times the flow rate of the β-diketone when expressed as a molar ratio and at conditions effective to oxidize the metallic film to produce a film of oxide thereof, to complex the oxide film with the β-diketone, and to sublimate the complex; and (b) intermittently varying the pumping speed of the exhaust system such that oxidation of the metallic film is the rate-determining step.

6. The method according to claim 5, wherein the β-diketone is hexafluoroacetylacetone.

7. The method according to claim 5, wherein the temperature inside the thin film deposition apparatus during steps (a) through (b) ranges from 100 to 400° C., and the pressure inside the thin film deposition apparatus is such that the partial pressure of oxygen is from 100 mTorr to 300 Torr during steps (a) through (b).

8. The method according to claim 5, wherein the metallic film is copper.

* * * * *